(12) United States Patent
Haworth et al.

(10) Patent No.: US 6,621,711 B1
(45) Date of Patent: Sep. 16, 2003

(54) ENCLOSURE FOR ELECTRONICS ASSEMBLY

(75) Inventors: Stephen Paul Haworth, Wokingham (GB); William Hunt Vincent, Yateley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/166,522

(22) Filed: Jun. 10, 2002

(51) Int. Cl.[7] .......................... H05K 7/12; H05K 7/14; H05K 5/00
(52) U.S. Cl. .................. 361/796; 361/801; 361/726; 361/747; 361/759; 211/41.17
(58) Field of Search ................... 361/796, 788, 361/801, 759, 787, 730, 726, 732, 747; 174/50, 50.52; 211/41.17

(56) References Cited

U.S. PATENT DOCUMENTS

| | | | |
|---|---|---|---|
| 5,124,886 A | * 6/1992 | Golobay | 361/391 |
| 5,593,219 A | 1/1997 | Ho | |
| 5,734,558 A | * 3/1998 | Poplawski et al. | 361/752 |
| 5,884,988 A | 3/1999 | Foo et al. | |
| 5,975,659 A | 11/1999 | Yang et al. | |
| 6,075,694 A | * 6/2000 | Mills et al. | 361/685 |
| 6,088,222 A | * 7/2000 | Schmitt et al. | 361/686 |
| 6,166,900 A | * 12/2000 | Flynn et al. | 361/685 |
| 6,256,205 B1 | * 7/2001 | Perry et al. | 361/753 |
| 6,267,606 B1 | * 7/2001 | Poplawski et al. | 439/92 |
| 6,388,875 B1 | * 5/2002 | Chen | 361/685 |
| 6,442,020 B1 | * 8/2002 | Liu et al. | 361/683 |
| 6,480,391 B1 | * 11/2002 | Monson et al. | 361/752 |

* cited by examiner

Primary Examiner—David Martin
Assistant Examiner—Dameon E. Levi
(74) Attorney, Agent, or Firm—Meyertons Hood Kivlin Kowert & Goetzel, P.C.; B. Noël Kivlin (57) ABSTRACT

An enclosure for an electronics assembly, comprises (i) a housing (1) having a recess (36); and
(ii) a module (40) for holding one or more components of the assembly, the module being insertable into the recess by sliding, and removable therefrom by sliding in a direction opposite to the direction of insertion; and
(iii) a spring retaining element (48) located in one of the housing and the module, the element being in the form of a resiliently deformable arm that engages the other of the housing and the module when the module is inserted into position within the recess in order to prevent removal of the module from the recess.

The arm can be manually bent to release the module from the recess, but the housing or the module allows a degree of movement of the retaining element during release of the module that is insufficient to allow the arm to bend beyond its elastic limit. The enclosure enables the module to be held firmly in place, but allows quick and easy release for maintenance of the assembly.

19 Claims, 5 Drawing Sheets

ENCLOSURE FOR ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise an enclosure, for example in the form of a supporting chassis that houses a motherboard or backplane and a number of daughterboards or module cards that extend in planes generally perpendicular to the plane of the motherboard. Other components may be included, such as power supply units, hard disc drives, tape drives, ROM drives etc., with the result that the space available for provision of all the services in the enclosure is severely limited, and no internal space of the enclosure can be wasted.

One form of computer, called "RAS computers" that is to say, computers that need to provide a high degree of reliability, availability and serviceability need to maximise the length of time during which the computer is operational. The computer may need to withstand a considerable degree of vibration, whether to particular office conditions or because of seismic activity, and so needs to exhibit a high degree of ruggedness. Furthermore, any periods during which the computer is down for example due to repair or maintenance should be minimised, which requires reducing the time taken to remove and reinstall any components of the system.

SUMMARY OF THE INVENTION

According to one aspect of invention, there is provided a spring retaining mechanism for an enclosure in the form of a leaf spring to retain the component(s) in the enclosure, but which is not permitted to move sufficiently to lose its elasticity over time.

According to another aspect of the invention, there is provided an enclosure for an electronics assembly, which comprises (i) a housing having a recess; and
(ii) a module for holding one or more components of the assembly, the module being insertable into the recess by sliding, and removable therefrom by sliding in a direction opposite to the direction of insertion; and
(iii) a spring retaining element located in one of the housing and the module, the element being in the form of a resiliently deformable arm that engages the other of the housing and the module when the module is inserted into position within the recess in order to prevent removal of the module from the recess, wherein the arm can be manually bent to release the module from the recess, but the housing or the module allows a degree of movement of the retaining element during release of the module that is insufficient to allow the arm to bend beyond its elastic limit.

The invention has the advantage that the electronics enclosure allows speedy removal and replacement of modular components thereof, but which will hold the components securely therein and will take up a minimum of space.

The module need not be a complete working unit of the electronics assembly, but may instead be in the form of a container that can house one or more other components thereof. The other components may themselves be modular, and may be insertable into the module by sliding, and be retained within the module by means of a retaining element as described above. In such a case, the module may be regarded as an enclosure that contains further modules.

The arm may have an intermediate shoulder that engages the module or the housing when the module is in position in the recess in order to retain the module within the recess. In such a case, the shoulder of the retaining element may engage the module or the housing at an intermediate point on the module (in the direction of insertion thereof) and the arm may extend further, for a sufficient distance that it extends beyond the end of the module in order to allow manipulation of the retaining element by the service engineer.

According to yet another aspect, the invention provides an enclosure for an electronics assembly, which comprises a housing having a recess, that can receive a module by sliding the module therein, the housing having a spring retaining element in the form of a resiliently deformable arm for preventing removal of the module from the recess, wherein the arm can be manually bent to release the module from the recess, but the housing allows a degree of movement of the retaining element during release of the module that is insufficient to allow the arm to bend beyond its elastic limit.

According to a further aspect, the invention provides a module for holding one or more components of an electronics assembly, the module being insertable into a recess in a housing by sliding, the module having a spring retaining element in the form of a resiliently deformable arm for preventing removal of the module from the recess, wherein the arm can be manually bent to release the module from the recess, but the module allows a degree of movement of the retaining element during release of the module that is insufficient to allow the arm to bend beyond its elastic limit.

6

DESCRIPTION OF PARTICULAR EMBODIMENTS

Figure 1:
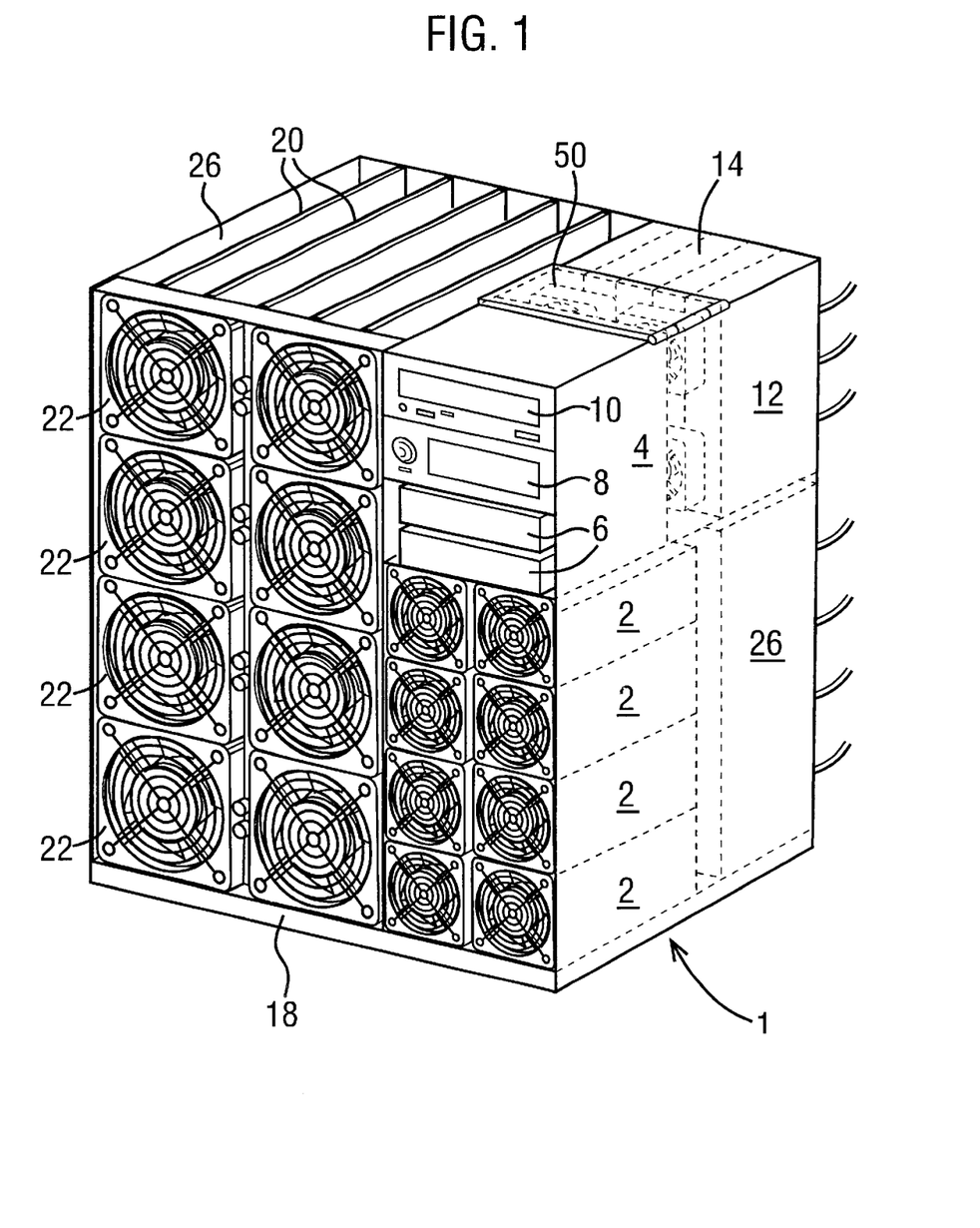
FIG. 1 is a schematic perspective view of an enclosure for an electronics assembly according to the present invention.

Referring now to the drawings, in which like reference numerals are used to designate corresponding elements, FIG. 1 shows an assembly according to one embodiment of the invention that forms part of a server that may be employed for a number of services, for example as part of a local area network (LAN) or for other telecommunications purposes, and is designed as a nineteen inch rack to be located in an electronics cabinet. The assembly may be employed in a so-called "RAS" system, that is to say, to have high reliability, availability and serviceability. As such, it is intended that the system will operated with the minimum amount of down time, and so a degree of redundancy is incorporated so that the system will continue to operate even when certain components have failed. In addition, servicing of the equipment should take as short a time as possible, so that, where practical, components that need to be replaced should simply be disconnected and removed, and a replacement component inserted. Furthermore, the assembly should be able to operate during seismic activity to telecoms standards.

The assembly comprises a chassis 1 in which the various components are located. The chassis contains a number of power supply modules 2 for receiving a.c. mains power or supply d.c. power from a power inlet connection module 26 and converting it to an appropriate d.c. voltage for the rest of the system. The assembly also includes a media area 4 that contains hard disc drives 6, a tape drive 8 and a CD-ROM or digital video disc (digital versatile disc) (DVD) drive 10, and a part 12 that contains a number of I/O cards 14. A motherboard is located within the chassis in a horizontal plane at the bottom of the chassis in a tray-shaped holder 18, and a number of daughterboards 20 are arranged next to each other in a vertical plane above the motherboard and to the side of the power modules 2. The daughterboards may serve any of a number of purposes, for example having CPUs or may be repeater boards etc. Also a number of fans 22 are provided in an array at the front of the chassis in order to blow air through the assembly between the daughterboards 20 for cooling.

Figure 2:
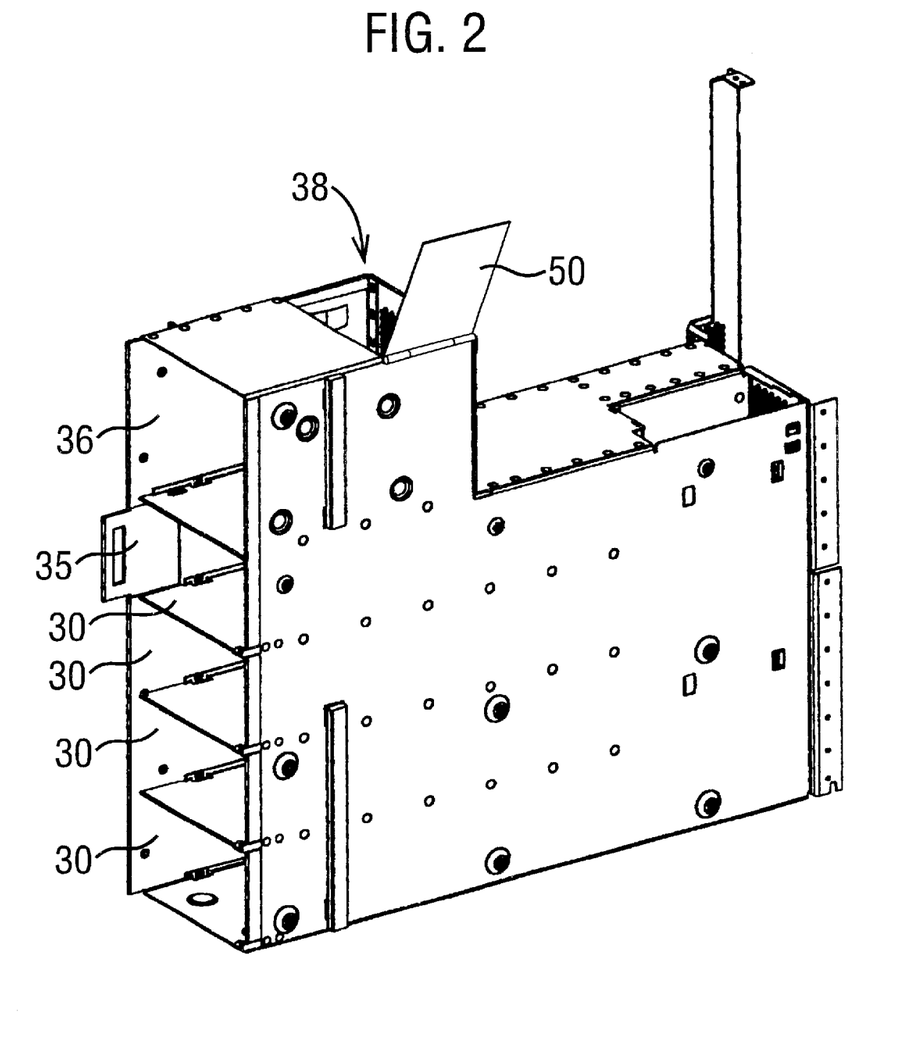
FIG. 2 is a perspective view of an internal sub-assembly of the enclosure of FIG. 1.
Figure 3:
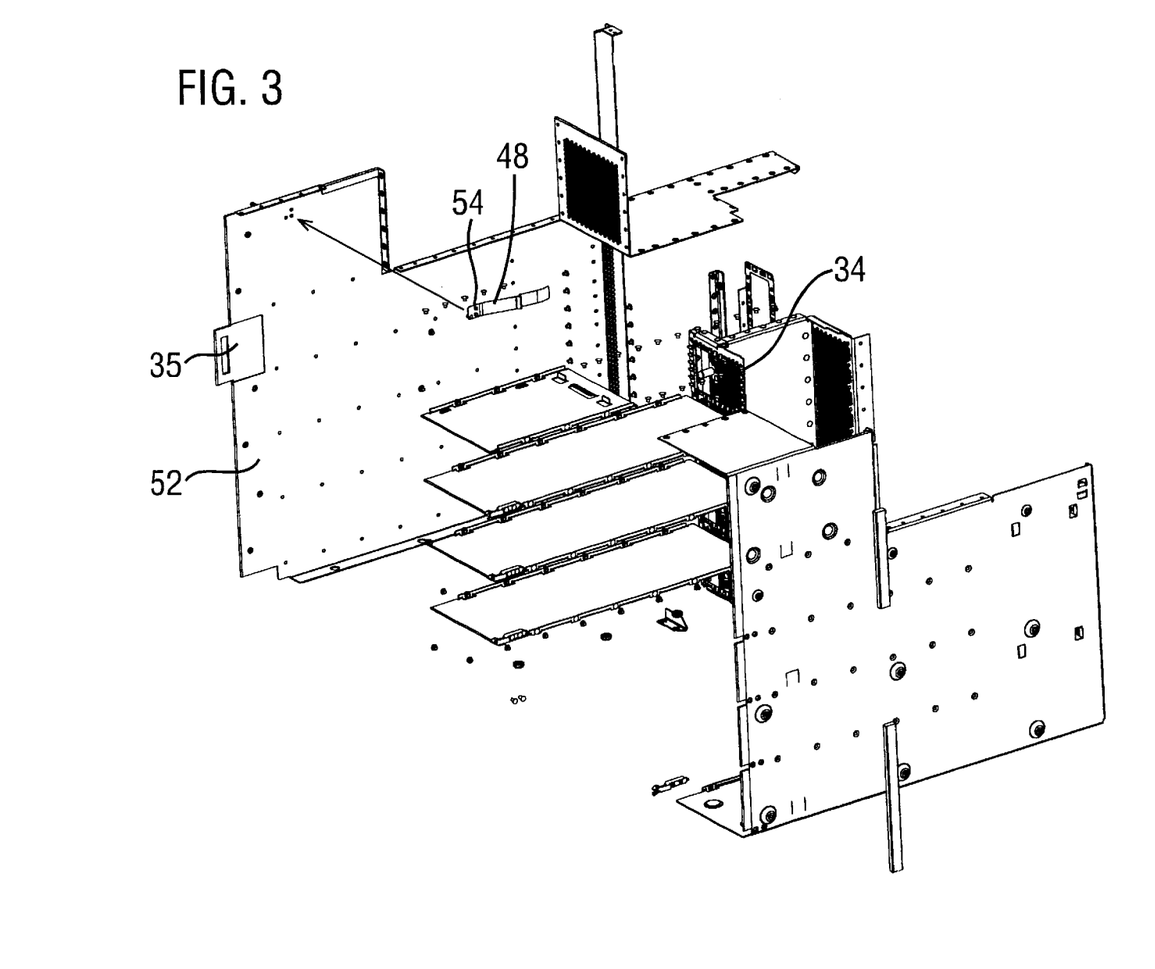
FIG. 3 is an exploded view of the sub-assembly shown in FIG. 2.

FIGS. 2 and 3 show a sub-assembly of the chassis in which the power inlet connection module 26, the power supply modules 2, the media area 4 and the I/O module cards 12 are located. The sub-assembly may be the form of a box having four recesses 30 at the front into which the power supply modules may be inserted, and one recess 32 at the rear into which the power inlet connection module 26 may be inserted, the recesses 30 being separated from the recess 32 by an internal bulkhead 34 that has apertures therein to allow electrical connection between the modules. Any convenient configuration may be used for the sub-assembly. The sub-assembly may be formed from any material having sufficient strength and lightness, for example 1.0, 1.2 or 1.5 mm steel or zinc plated steel or aluminium zinc plated steel.

A latch plate 35 is provided on the side wall of the topmost recess 30 and extends out of the front of the sub-assembly for a short distance in order to allow a front panel or door (not shown) of the assembly to be secured by means of a lock mechanism.

Figure 4:
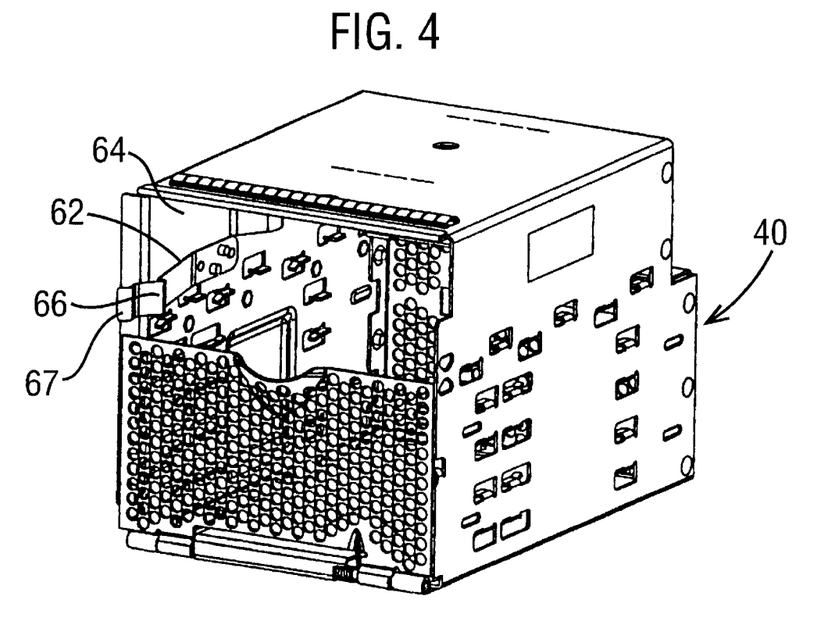
FIG. 4 is a perspective view of a module that can be employed in the sub-assembly of FIGS. 2 and 3.
Figure 5:
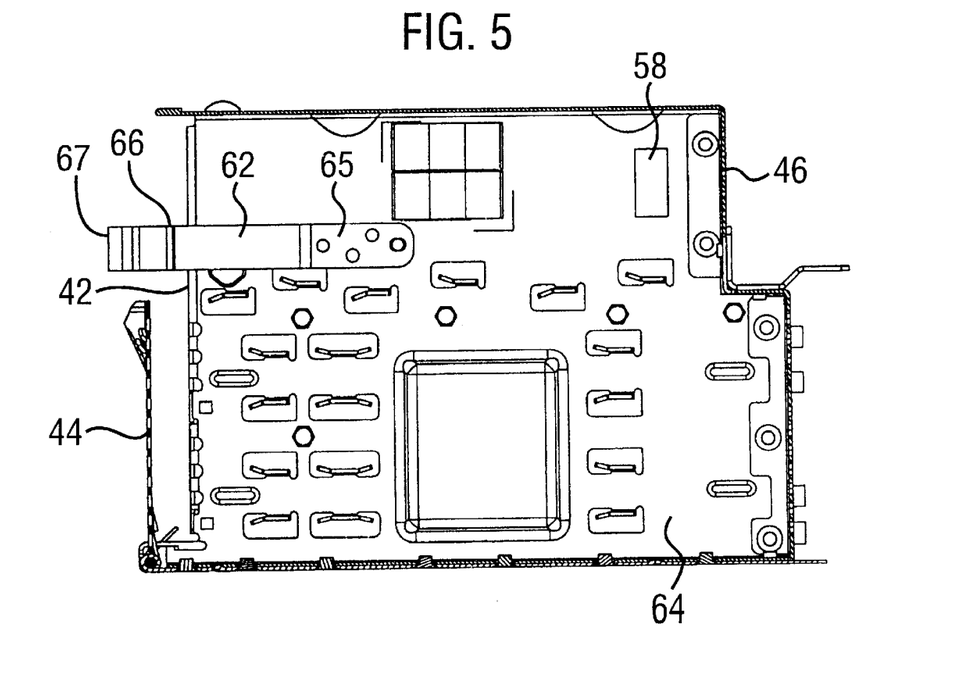
FIG. 5 is a side sectional elevation of the module of FIG. 4.
Figure 6:
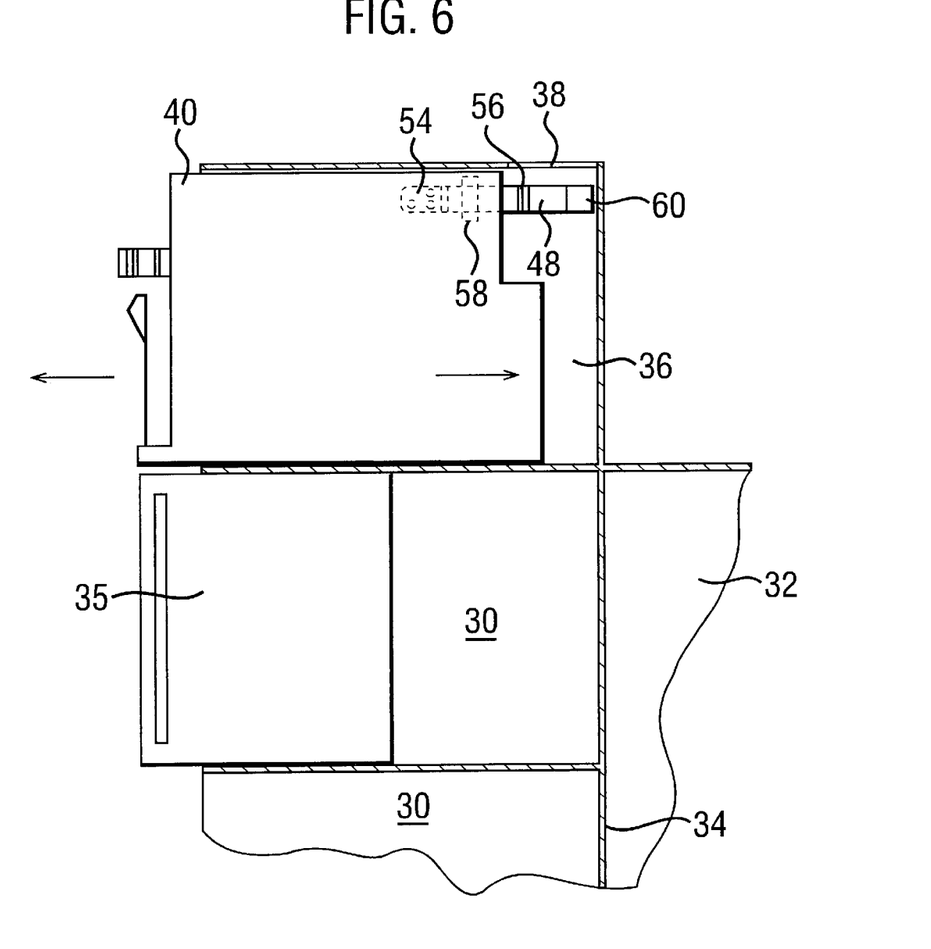
FIG. 6 is a schematic side sectional elevation of part of the sub-assembly of FIGS. 2 and 3 and the module of FIGS. 4 and 5 partly inserted therein.

Above the topmost recess 30, a further recess 36 is located which defines the media area 4 shown in FIG. 1. This recess has access not only from the front of the chassis, but also from the top via aperture 38 which is closed in operation by a door 50. A media bay module 40 for insertion into the recess 36 is shown in FIGS. 4 and 5. The module has a generally rectangular box structure having a front surface 42 the lower part of which is closed by means of partition 44 that is biassed to its vertical (closed) position, but can be swung open to allow insertion and removal of the hard drive units 6. The partition 44 is perforated in order to allow a flow of air therethrough to cool the various components that are housed within the module. The upper part of the media bay module is intended to contain the tape drive 8 which can be inserted into the front of the module and connected to a backplane located on the rear wall 46 of the upper part of the module. The hard drives 6, and tape drive 8 will normally all be installed in the media bay module 40 before insertion in the chassis and may be removed independently if they require replacement. The module containing the relevant drives will be a field replaceable item, so that, if there is a failure of any of the pcbs of the module the entire media unit may be replaced. In this case, functioning drives may be retained.

Figure 7:
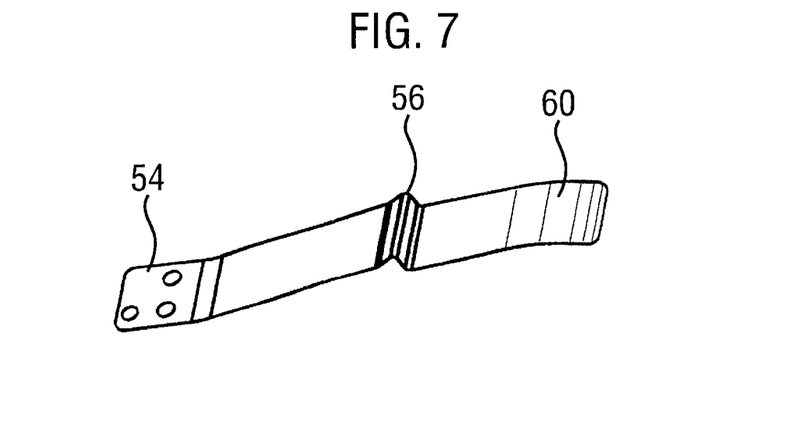
FIG. 7 is a perspective view of a spring arm for retaining the module within the sub-assembly.

The sub-assembly is provided with a spring retaining element 48, shown in greater detail in FIG. 7, located on the side wall 52 of the sub-assembly adjacent to the daughterboards 20 in the recess 36 for the media bay module 40. The retaining element 48 is formed from 0.25 mm thick spring stainless steel (although other materials of similar resilience may be used), and is fixed to the side wall 52 of the sub-assembly at its front end 54. The retaining element is bent to form a rearwardly facing shoulder 56 approximately 50 mm from the fixed front end, although the distance between the front end and the shoulder may vary from at least approximately about 20 mm up to 200 mm or more. When the media bay module 40 is inserted into the recess 36, the shoulder of the retaining element 48 engages the rear edge of an aperture 58 to prevent the module 40 being removed from the front end of the recess 36. This form of retaining element can hold the module in place not only during vibrations that may be encountered in a normal office environment, but also during seismic activity. The retaining element also extends beyond the shoulder 56 by a further distance of approximately 50mm so that, when the media bay module 40 is in position in the recess 36, the end 60 thereof opposite the fixed end 54 is located behind the rear end of the media bay module.

The shape of the retaining element is such that it extends away from the side wall 52 of the sub-assembly, that is to say, in a direction normal to the side wall, by a short distance, for example between about 5 and about 15 mm to enable it to be manually moved toward the side wall by this distance to release the aperture 58. The degree of lateral movement is limited by the presence of the side wall 52 so that the element can be moved by only a small fraction of the length of the retaining element (i.e. the distance between the fixed end thereof and the shoulder 56). This means that the retaining element can never be bent beyond its elastic limit, and will therefore be capable of allowing removal and replacement of the module 40 many times during the life of the assembly.

In order to install the media bay module, it can simply be pushed into the recess 36 from the front end of the recess. Once the module has been inserted to its correct position, and is retained therein by the retaining element, it may be electrically connected by manually mating electrical connectors on the components in the module. In order to do this, the service engineer may obtain access to the rear of the module via the aperture 38 in the rear part of the top surface of the recess 36.

In order to replace any of the drives in the event of a fault, the service engineer simply powers down the assembly, opens the door 50 to expose the aperture 38 in the recess 36, disconnects the drives from the assembly by disconnecting any electrical connectors (not shown) at the rear of the module, and pulls out the media bay module 40 from the front of the chassis after first releasing the retaining element 48. This can be achieved simply by inserting a digit into the recess 36 via aperture 38 and pressing the free end 60 of the element against the side wall of the recess. This can be performed with one hand, leaving the other hand free to receive the media bay module 40 from the front of the recess 36. This arrangement has the advantage that removal of the media bay requires access through the top of the chassis. This requires access by means of a tool and thus reduces the risk of inadvertent removal of the unit and consequent cable/connector damage.

The media bay module 40 may itself be provided with a retaining element of the form described above. The module 40 has a further retaining element 62 formed from spring stainless steel that is located in a side wall 65 therein and is fixed to the side wall at the rear end 64 of the retaining element so that the retaining element extends out of the front of the module 40 for a short distance. The retaining element has, in the region of the free front end 67 thereof a shoulder 66 that faces rearwardly away from the front of the module.

The media bay module can accept a further module, for example a tape drive, that is inserted into the front of the media bay module 40 and held therein by means of the further retaining element 62. The shoulder 66 may, for example engage the front face of the tape drive to prevent removal of the tape drive from the front of the module. In this case, no access to the rear part of the media bay module is necessary because electrical connection to the backplane on the rear wall 46 of the module 40 will be made simply by insertion of the tape drive. In order to remove the tape drive, the front end 67 of the retaining element is manually moved sideways until it rests against the side wall of the module and releases the tape drive.

The invention has been described with reference to a media bay module 40 that can be inserted into the chassis of an electronics assembly, but it will be appreciated that the invention is applicable to any instance where a modular component will be inserted by sliding into an electronics assembly, and could, for example be employed to retain the power supply modules 2 in place if desired.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An enclosure for an electronics assembly, which comprises
   (i) a housing having a recess; and
   (ii) a module for holding one or more components of the assembly, the module being insertable into the recess by sliding, and removable therefrom by sliding in at direction opposite to the direction of insertion; and
   (iii) a spring retaining element located in one of the housing and the module, the element being in the form of a resiliently deformable arm that engages a first aperture in the other of the housing and the module when the module is inserted into position within the recess in order to prevent removal of the module from the recess,
   wherein the housing has a second aperture in a side wall of the recess through which a user's digit may be inserted into the recess to press a free end of the arm, so that the arm can be manually bent to release the module from the recess, but the housing or the module allows a degree of movement of the remaining element during release of the module that is insufficient to allow the arm to bend beyond its elastic limit.

2. An enclosure as claimed in claim 1, wherein the arm is in the form of a leaf spring.

3. An enclosure as claimed in claim 1, wherein the arm is attached to a wall of the recess or the module is separated from the wall so that it must be bent toward the wall to release the module from the recess.

4. An enclosure as claimed in claim 1, wherein the arm extends in the direction of insertion or release of the module.

5. An enclosure as claimed in claim 1, wherein the arm has an intermediate shoulder that engages the module or the housing when the module is in position in the recess to retain the module within the recess.

6. An enclosure as claimed in claim 5, wherein the shoulder engages the module or the housing at an intermediate point on the nodule (in the direction of insertion or removal thereof) and the arm extends beyond the shoulder for a sufficient distance that it extends beyond an end or the module to allow manipulation of the retaining element.

7. An enclosure as claimed in claim 1, wherein the second aperture allows manual access to the recess in order to operate The retailing element to release the module.

8. An enclosure as claimed in claim 7, wherein manual access is allowed only by means of a tool.

9. An enclosure for an electronics assembly, which comprises:
   (i) a housing having a recess; and
   (ii) a module for holding one or more components of the assembly, the module being insertable into the recess by sliding, and removable therefrom by sliding in a direction opposite to the direction of insertion; and
   (iii) a spring retaining clement located in one of tie housing and the module, the clement being in the form of a resiliently deformable arm that engages the other of the housing and the module when the module is inserted into position within the recess in order to prevent removal of the modulo from the recess,
   wherein the arm can be manually bent to release the module from the recess, but the housing or the module allows a degree of movement of the retaining element during release of the module that is insufficient to allow the arm to bend beyond its elastic limit;
   wherein the arm has a length of at least about 5 cm between the point at which it is attached to one of the housing and the module and the point at which it engages the other of the housing and the module.

10. An enclosure as claimed in claim 1, wherein the module is in the form of a container that can house one or more components of the assembly.

11. An enclosure for an electronics assembly, which comprise
   (i) a housing having a recess; and
   (ii) a module for holding one or more components of the assembly, the module being insertable into the recess by sliding, and removable therefrom by sliding in a direction opposite to the direction of insertion; and
   (iii) a spring retaining element located in one of the housing and the module, the element being in the form of a resiliently deformable arm that engages the other of the housing and the module when the module is inserted into position within the recess in order to prevent removal of the module from the recess, wherein the arm can be manually bent to release the module from the recess, but the housing or the module allows a degree of movement of the retaining element during release of the module that is insufficient to allow the arm to bend beyond its elastic limit, and wherein the or each component is itself modular, and is insertable into the module by sliding, aid removable therefrom by sliding in a direction opposite to tie direction of insertion, one of the module and the component having a further spring retaining element in the form of a resiliently deformable arm that engages the other of the module and the component when the component is inserted into the module in order to prevent removal of the component from the module, the arm being manually bendable to release the component from the module, but the module or the component allowing a degree of movement of the retaining clement during release of the component that is insufficient to allow the arm of the further spring retaining element to bend beyond its elastic limit.

12. An enclosure as claimed in claim 10, wherein one of the module and the component has a further spring retaining element in the form of a resiliently deformable arm that engages the other of the module and the component when the component is inserted into the module in order to prevent removal of the component from the module, the arm being manually bendable to release the component from the module, but the module or the component allowing a degree of movement of the retaining clement during release of the component that is insufficient to allow the arm of the further spring retaining element to bend beyond its elastic limit.

13. An enclosure as claimed in claim 11, wherein the or at least one of the components has a connector for connecting it to a fixed component in the enclosure, the connector being supported by a cable and requiring manual connection and disconnection.

14. An enclosure for an electronics assembly, which comprises:
(i) a housing having a recess;
(ii) a module that can be received by the housing by sliding the module therein
(iii) a spring retaining element in the housing that resiliently deformable arm that engages a first aperture in the other of the housing and the module when the module is inserted into position within the recess for preventing removal of the module from the recess;
wherein the housing has a second aperture in a wall of the recess through which a user's digit may be inserted into the recess to press a free end of the arm, so that the arm can be manually bent to release the module from the recess, but the housing allows a degree of movement of the retaining clement during release of the module that is insufficient to allow the arm to bend beyond its elastic limit.

15. An enclosure as claimed in claim 1, wherein the arm terminates behind the module in the direction of removal of the module from the recess.

16. An enclosure as claimed in claim 1, further comprising a door coupled to the housing for covering the second aperture when the door is in the closed position.

17. An enclosure as claimed in claim 1, wherein the spring retaining clement is located inside the housing.

18. An enclosure as claimed in claim 1, wherein the user's digit presses a free end of the arm against a side wall of tile recess to release the module.

19. An enclosure as claimed in claim 11, further comprising a door couple to the housing for covering an aperture in a wall of the recess, through which a user's digit may be inserted into the recess to press a free end of the inn, when the door is in the closed position.

* * * * *

UNITED STATES PATENT AND TRADEMARK OFFICE
CERTIFICATE OF CORRECTION

PATENT NO. : 6,621,711 B1
DATED : September 16, 2003
INVENTOR(S) : Haworth et al.

It is certified that error appears in the above-identified patent and that said Letters Patent is hereby corrected as shown below:

Column 5,
Line 57, please change "at" to -- a --.
Line 66, please change "side".

Column 6,
Line 4, please change "remaining" to -- retaining --.
Line 20, please change "nodule" to -- module --.
Line 22, please change "or" to -- of --.
Line 26, please change "The retailing" to -- the retaining --.
Lines 36 and 37, please change "clement" to -- element --.
Line 36, please change "tie" to -- the --.
Line 41, please change "modulo" to -- module --.
Line 56, please change "comprise" to -- comprises --.

Column 7,
Line 7, please change "aid" to -- and --.
Line 8, please change "tie" to -- the --.
Lines 17 and 29, please change "clement" to -- element --.

Column 8,
Line 5, please insert -- and -- after "therein".
Line 6, please insert -- is in the form of a -- after "that".
Lines 16 and 26, please change "clement" to -- element --.
Line 28, please change "tile" to -- the --.
Line 31, please change "couple" to -- coupled --.
Line 33, please change "inn" to -- arm --.

Signed and Sealed this

Thirteenth Day of January, 2004

JON W. DUDAS
*Acting Director of the United States Patent and Trademark Office*